United States Patent [19]
Andreas et al.

[11] Patent Number: 5,994,896
[45] Date of Patent: Nov. 30, 1999

[54] ELECTRICAL SWITCH

[76] Inventors: Olaf Andreas, Talblivck 30, D-93138 Lappersdorf; Manfred Glehr, Sudetenstrasse 38, D-93073 Neutraubling, both of Germany

[21] Appl. No.: 09/157,659

[22] Filed: Sep. 21, 1998

[30] Foreign Application Priority Data

Sep. 19, 1997 [DE] Germany .................. 197 41 367

[51] Int. Cl.⁶ .................. G01B 7/14; G01B 7/30; H01F 21/06
[52] U.S. Cl. .................. 324/207.17; 307/104; 307/112; 336/135
[58] Field of Search .................. 307/104, 112, 307/116, 652, 125, 139; 361/179, 180, 268; 327/510, 517; 73/862.332; 336/20, 132, 135; 324/209, 207.11, 207.13, 207.15, 207.17, 207.18, 207.19, 207.25

[56] References Cited

U.S. PATENT DOCUMENTS

| | | | |
|---|---|---|---|
| 4,100,480 | 7/1978 | Lytle et al. | 324/207.17 |
| 4,857,919 | 8/1989 | Braswell | 324/207.17 |
| 5,621,317 | 4/1997 | Wozniak | 324/207.13 |
| 5,841,273 | 11/1998 | Muraji | 324/207.17 |

FOREIGN PATENT DOCUMENTS

| | | |
|---|---|---|
| 3506293A1 | 9/1986 | Germany . |
| 4006596A1 | 9/1991 | Germany . |

*Primary Examiner*—Richard T. Elms
*Attorney, Agent, or Firm*—Herbert L. Lerner; Laurence A. Greenberg

[57] ABSTRACT

A switch lever of an electrical switch can be moved into various switch positions. A ferrite core is disposed at the switch end of the switch lever. A primary coil and a secondary coil are disposed about each switch setting. The primary coil induces a voltage in each secondary coil. The amplitude of the induced voltage is greatest in the secondary coil in the vicinity of which the ferrite core is situated. The actually adopted switch position can be determined from the difference in the voltages.

6 Claims, 3 Drawing Sheets

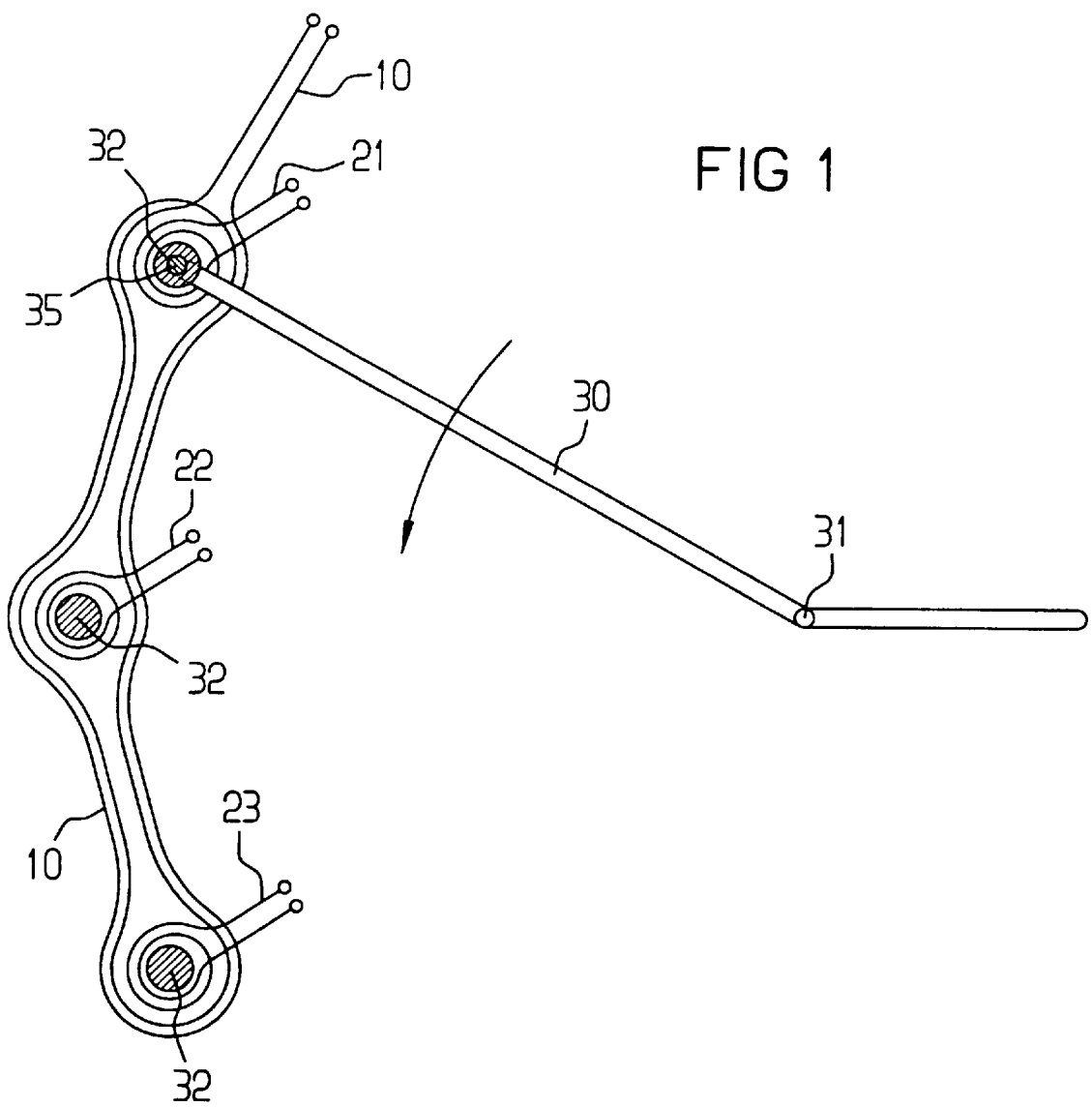

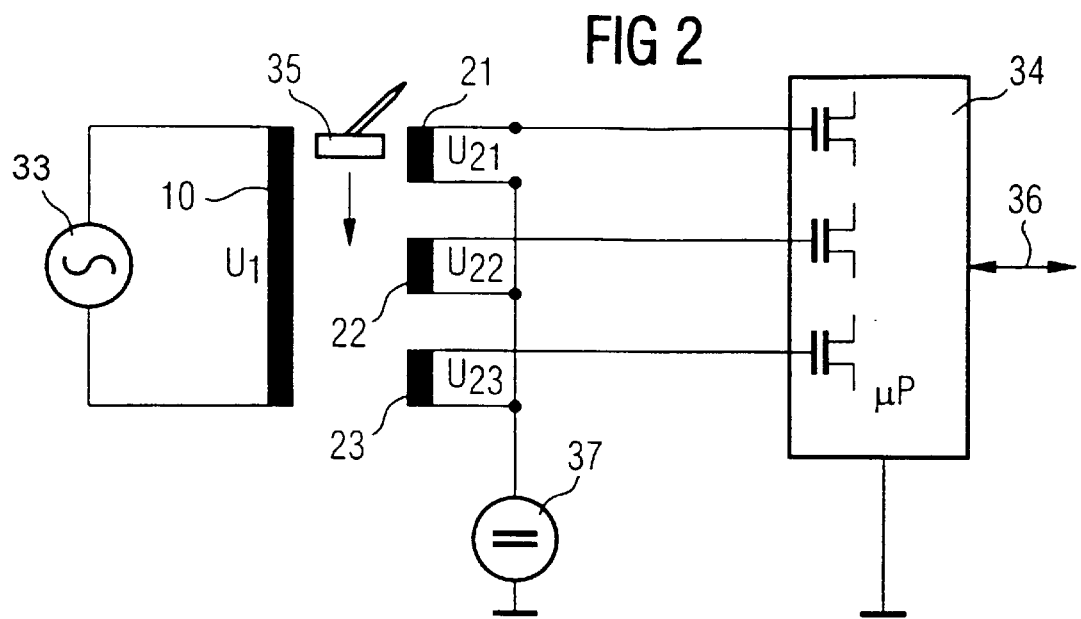
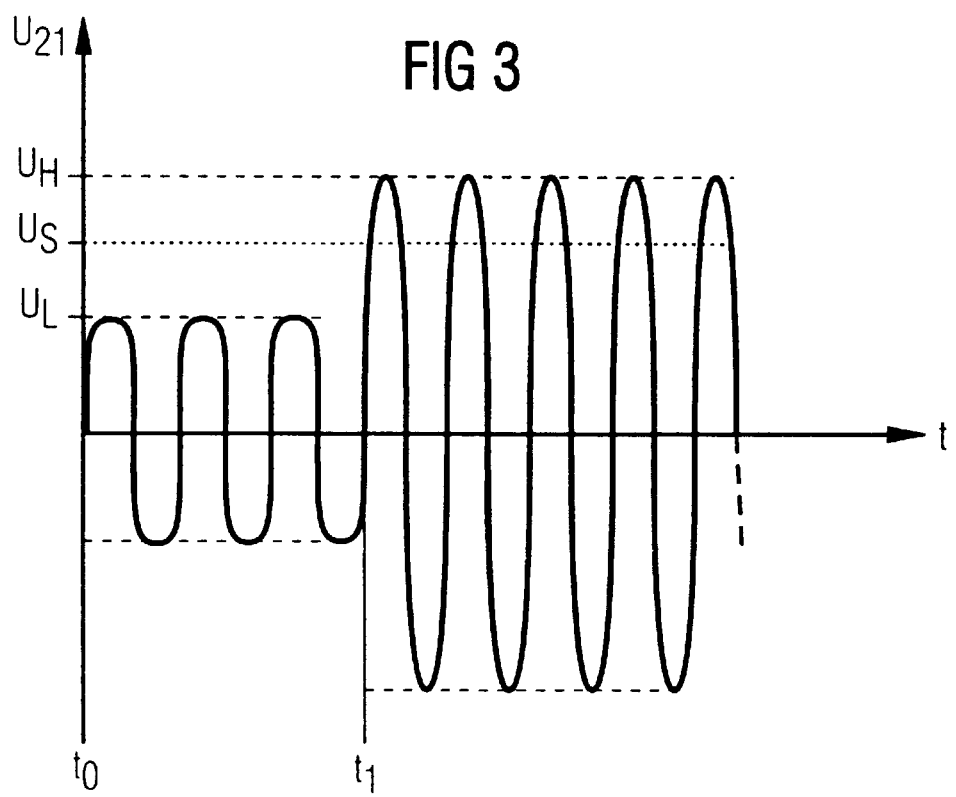

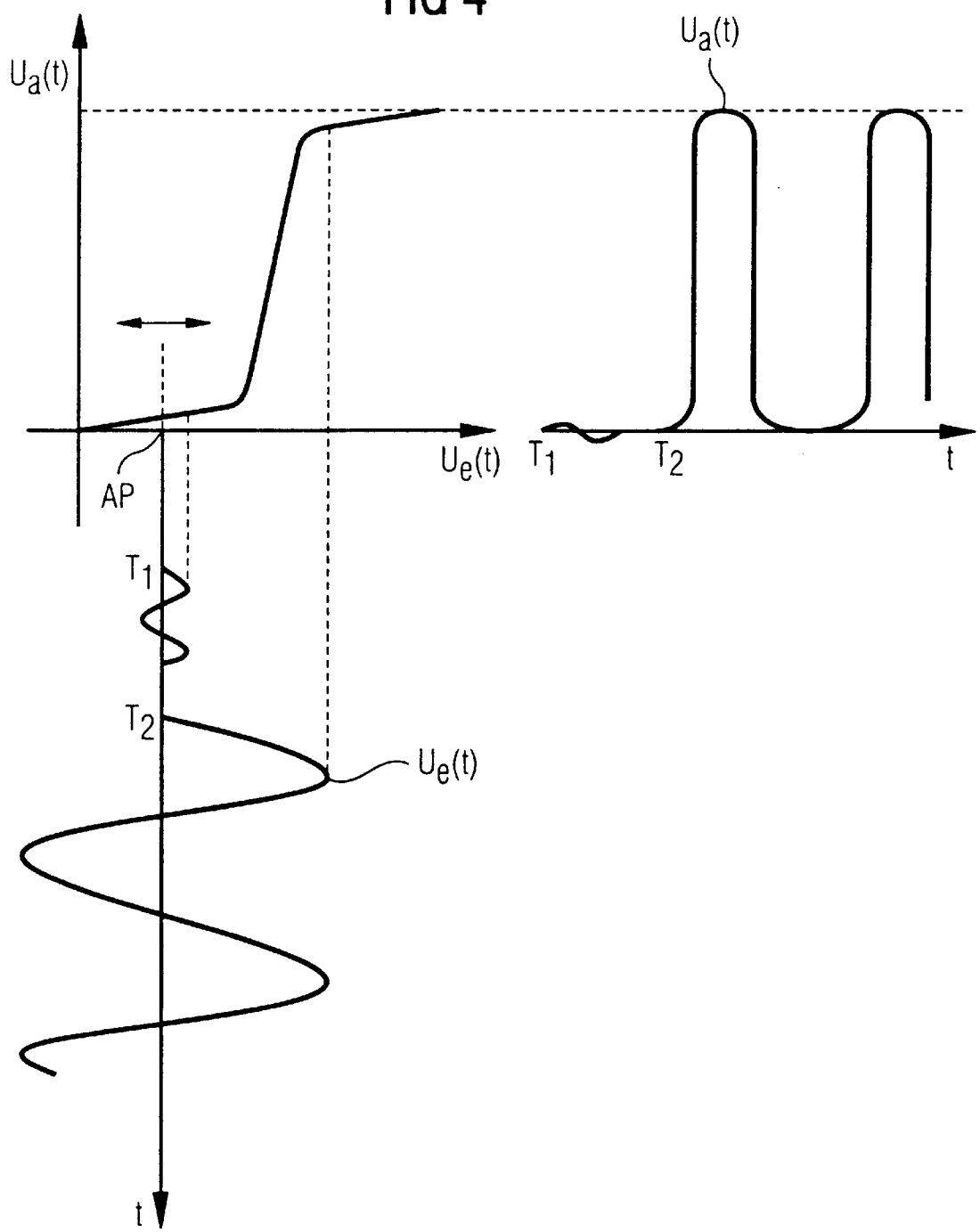

ELECTRICAL SWITCH

BACKGROUND OF THE INVENTION

Field of the Invention

The invention relates to an electrical switch. In many practical applications, in particular in automobile engineering and in mechanical and systems engineering, it is necessary to reliably recognize, and to transmit to other units, the position of a switch lever or of a movable machine part that can adopt a plurality of different settings or switch positions. One such switch is known from German published patent application DE 40 06 596 A1. The switch position is detectermined in wireless fashion by means of Hall sensors. Detection by means of Hall sensors, however, is very costly.

SUMMARY OF THE INVENTION

It is accordingly an object of the invention to provide an electrical switch, which overcomes the disadvantages of the prior known devices and methods of this general type and which allows the switch position to be recognized reliably and in a simple fashion.

With the foregoing and other objects in view there is provided, in accordance with the invention, an electrical switch, comprising:

- a switch lever with a first end movably disposed into at least two switch setting positions each defining a respective switch function of the electrical switch;
- a magnetic flux amplifying element disposed at the first end of the switch lever;
- inductive pickups associated with each of the switch setting positions and disposed so as to be adjacent the magnetic flux amplifying element when the switch lever is moved into one of the switch setting positions; and
- an evaluating unit connected to the inductive pickups evaluating signals of the inductive pick-up and determining which of the switch setting positions have been adopted by the switch lever.

In other words, the switch lever is movable into two or more switch settings. An inductive pick-up is allocated to each switch setting, to recognize the switch position of the switch lever. The switch lever carries an element that is conductive to magnetic flux and which locally amplifies a magnetic flux generated by a primary coil. The local increase in magnetic flux is detected by the inductive pick-up and is utilized for the evaluation of the switch position.

In accordance with an added feature of the invention, there is provided a primary coil acting as an exciter unit, and the inductive pick-ups are a plurality of secondary coils allocated to the primary coil.

The secondary coil may be disposed in simple fashion as a conductor track on a printed circuit board. Around the secondary coils there are disposed one or more primary coils which generate in each instance a magnetic field by which a voltage is induced in the secondary coils. The primary coils may likewise be designed as conductor tracks on a printed circuit board.

Advantageously, an alternating voltage is applied to the primary coil, which then induces an alternating voltage in the secondary coils. If the element which is conductive to magnetic flux is disposed in the vicinity of a secondary coil, then the alternating voltage in that secondary coil is increased, as compared with an adjacent secondary coil, as a consequence of a local amplification of magnetic flux.

In accordance with another feature of the invention, an exciter unit is driven by the evaluating unit and connected to the primary coil for generating an alternating magnetic field inducing in the secondary coils respective alternating voltages. The evaluating unit measures and evaluates the alternating voltages.

In accordance with again an additional feature of the invention, the magnetic flux amplifying element is produced from a paramagnetic materials or a ferromagnetic material. The primary coil generates the magnetic flux, the magnetic flux is amplified in a region of the magnetic flux amplifying element, and is conducted to one of the inductive elements (secondary coils). In other words, the end of the switch lever or the entire lever may be produced from a ferrite.

Other features which are considered as characteristic for the invention are set forth in the appended claims.

Although the invention is illustrated and described herein as embodied in an electrical switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a plan view of an electrical switch according to the invention;

FIG. 2 is a schematic block diagram of the switch of FIG. 1;

FIG. 3 is a graph of a voltage progression of a voltage induced in a secondary coil; and FIG. 4 is a graph of the characteristics for setting a working point.

DESCRIPTION OF THE PREFERRED EMBODIMENTS

Referring now to the figures of the drawing in detail and first, particularly, to FIG. 1 thereof, there is seen an electrical switch with a switch lever 30. The switch, by being actuated, moves into different, specified switch positions. To this end, the switch lever 30 has a pivot bearing 31, about which the switch lever 30 is pivoted when a force acts on one end of the switch lever 30. The other end of the switch lever 30 (the position-side end) then pivots into the various switch positions.

For the following exemplary embodiment, it is assumed that one end of the switch lever 30 contacts a contact surface 32 in each switch position. Galvanic electrical connections are thereby created. In this case, the position-side end of the switch lever 30 can register in the switch positions, so that a defined positioning is adopted. Electrical connections leading away from the contact surface 32 are not specifically illustrated for the sake of clarity.

The position-side end of the switch lever 30 can also be designed without electrical contacting. The contacting can be designed at another position of the switch lever 30, as a consequence of which the contact surfaces 32 are disposed at a correspondingly different position. The location of the electrical contact (formation of an electrical connection) is not essential to the invention. It is essential that the position-side end of the switch lever 30 adopts a switch position in each instance (in this position, some electrical connection or other is closed or opened). And it is now of importance to clearly detect this switch position.

The switch lever 30 is situated in a first switch position in FIG. 1. A first electrical connection is created or opened. In this case, two further switch positions are also available. When the switch lever 30 is moved into the second or third switch position, other electrical connections or no connection (open switch) are then created. Accordingly, the switch represents a three-pole switch.

Around the contact surfaces 32 there is disposed in each instance a secondary coil 21, 22, 23 forming an inductive pick-up for detecting the switch position. One or more primary coils 10—forming exciter units—are disposed around all the secondary coils 21, 22, 23. The primary coils 10 and the secondary coils 21, 22, 23 are magnetically coupled to one another.

With reference to FIG. 2, the primary coil 10 is connected to an oscillator 33, which drives the primary coil 10 with an alternating voltage. As a consequence, an alternating electromagnetic field is generated by the primary coil 10. Due to the magnetic coupling of the primary coil 10 and the secondary coils 21, 22, 23, an alternating voltage is induced in each secondary coil 21, 22, 23.

The functionality of the switch according to the invention can be represented by an equivalent circuit similar to a transformer. If the primary coil 10 is excited to oscillate by the oscillator 33 with an alternating voltage $U_1$, then in each instance one voltage $U_{21}$, $U_{22}$ and $U_{23}$, respectively, is induced in the three secondary coils 21, 22, 23 which are spatially separated from one another.

Depending upon the switch position, the switch lever 30 moves from one switch position to the next and thus also from one secondary coil 21, 22 or 23 to the next. The switch lever 30 acts as matter (iron core of a transformer), which is movably disposed between the primary coil 10 and the secondary coils 21, 22, 23. The movement is indicated by the single arrows in FIGS. 1 and 2.

One terminal of each secondary coil 21, 22 and 23 is connected to an evaluating unit 34. The other terminals of each secondary coil 21, 22 and 23 is at reference potential (ground or bias voltage). The alternating voltages induced in the secondary coils 21, 22, 23 are measured in the evaluating unit 34 and compared with one another. From this, it is possible to determine the physical switch position and to output a corresponding signal via a data line 36 to further units for further processing.

The objective is to reliably recognize the switch position of the switch lever 30. This is recognized by reference to the voltage induced in the secondary coils 21, 22 and 33. However, the induced voltage of that secondary coil 21, 22 or 23 in which the switch lever 30 is situated must then be clearly distinguished, in terms of voltage, from the other induced voltages $U_{2i}$.

According to the invention, the induced voltage $U_{2i}$ of that secondary coil 21, 22 or 23 in the region of which the switch lever 30 is positioned is increased. To this end, the switch lever 30 has an element (designated as ferrite core 35 in the text which follows) which is conductive to a magnetic field and which amplifies magnetic flux. The ferrite core 35 is situated at least at the position-side end of the switch lever 30. It is also possible for the entire switch lever 30 to be designed as ferrite core 35. When the switch lever 30 adopts a switch position, the ferrite core 35 is then situated in the vicinity of a secondary coil 21, 22 or 23.

The voltage $U_{2i}$ (where i=1, 2, 3, . . . ) induced in a secondary coil 21, 22 or 23 is a function of the number of windings N of the secondary coil and the magnetic flux Φ generated by the primary coil 10:

$$U_{2i} = N\frac{d\Phi}{dt} \qquad (1)$$

The magnetic flux Φ is a function of the magnetic induction B and the area A permeated by the magnetic flux Φ:

$$\Phi = \int_A B \cdot dA \qquad (2)$$

The magnetic induction B is a function both of the relative and of the absolute permeability, $\mu_r$ and $\mu_0$ respectively, and also of the magnetic field strength H:

$$B = \mu_0 \mu_r H \qquad (3)$$

This gives—in simplified form—for the voltage $U_{2i}$ induced in the secondary coil:

$$U_{2i} = N \cdot \mu_r \cdot H_r \cdot A \qquad (4)$$

If the winding areas of the secondary coils 21, 22, 23 are equally large and the primary coil 10 generates a magnetic field with equally large magnetic field strength H, then the voltage $U_{2i}$ induced in a secondary coil is a function, inter alia, of the relative permeability $\mu_r$ of the material (i.e. of its magnetic behavior), which is situated in the region of the allocated secondary coil 21, 22 or 23, within the magnetic field. If the switch lever 30 is situated between the primary coil 10 and a secondary coil 21, 22 or 23, then the magnitude of the induced voltage $U_{2i}$ depends on the ferrite core 35.

In FIG. 3, by way of example, the voltage $U_{2i}$ induced in the first primary coil 10 is plotted against time t. At the start (low amplitude), the switch lever 30 is still situated, during the time between the instants $t_0$ and $t_1$, in another switch position. Accordingly, only a relatively low voltage is induced. At the instant $t_1$, the switch lever 30 is moved into the first switch position. The amplitude of the induced voltage $U_{21}$ increases from the amplitude value $U_L$ to the amplitude value $U_H$. The ferrite core 35 increases the magnetic flux, and a higher voltage is induced in the secondary coil 21.

Since the ferrite core 35 consists of a material having a relative permeability $\mu_r > 1$, the voltage $U_{2i}$ induced in the secondary coils 21, 22, 23 is essentially distinguished by the factor of the relative permeability $\mu_r$ of the ferrite core 35. The greater the relative permeability $\mu_r$ of the ferrite core 35, the greater the difference in the magnitude of the induced voltages $U_{2i}$ becomes.

When the switch lever 30 having the ferrite core 35 of high relative permeability $\mu_r \gg 1$ (e.g. ferromagnetic material) is situated, by way of example, in the first switch position, then a far higher voltage $U_{21}$ is induced in the first secondary coil 21 than in the other two secondary coils 22 or 23, because the magnetic flux in the region of the secondary coil 21 is increased by the ferrite core 35. The evaluating circuit recognizes in which secondary coil 21, 22 or 23 the highest induced voltage $U_{2i}$ is measured. Thus, the switch position can be determined without great expenditure, in a simple and reliable manner.

The recognized switch position is transmitted via a data line 36 to other connected units. The evaluating unit 34 controls the recognition of the switch positions. It can also energize the oscillator 33, so that a measurement of the induced voltages $U_{2i}$ can be made. As long as the detection of the actually adopted switch position is not required, the oscillator 33 and the evaluating unit 34 can be in their neutral condition, so that energy is saved.

Simple amplifier inputs, in the form in which they are exhibited by the digital evaluating unit 34, have a nonlinear transmission behavior in accordance with FIG. 4. There, the transmission behavior is represented in the form of a voltage characteristic. The voltage characteristics are thereby represented in FIG. 4 for the input transmission behavior at the top left, for an input voltage $U_e(t)$ at the bottom left and for an output voltage $U_a(t)$ of the input amplifier stage at the top right. In this case, the input voltage $U_e(t)$ corresponds to the induced voltage $U_{2i}$. T1 identifies voltage progressions in which the ferrite core 35 has no influence on the induced voltage $U_{2i}$, as against which, in the case of the voltage progressions identified by T2, the ferrite core 35 effects an increase in the induced voltage $U_{2i}$.

In order that it should be possible to recognize even small differences in the amplitudes of the maximum and minimum possible magnitude of the induced voltages $U_{2i}$ and thus of the input voltage $U_e(t)$, it is necessary to bring a working point AP for the amplifier input close to the steep rise in the characteristic for the input transmission behavior. In the circumstances, the smaller amplitudes of the induced voltages $U_{2i}$ effect no further alteration of the output voltage $U_a(t)$, while in contrast the larger amplitudes do so.

To distinguish the differing magnitudes (amplitudes) of the induced voltages $U_{2i}$ (as a consequence of the influence of the ferrite core 35) and by reason of production tolerances, the working point AP must in the first instance be specified. This working point AP represents a threshold voltage $U_s$, which lies between the induced voltage $U_{2i}$ without ferrite core 35 and the induced voltage $U_{2i}$ with ferrite core 35. The working point AP is set with the aid of a direct voltage source 37. The direct voltage source 37 delivers a bias voltage, by which the induced voltages are raised or lowered with respect to a reference potential. The amplitudes of the induced voltages $U_{2i}$ are however not altered thereby.

In this case, the induced voltages $U_{2i}$ are displaced in their direct voltage potential to such an extent that the working point, i.e. the position of the threshold voltage $U_s$, lies between the two possible amplitude values $U_L$ and $U_H$ of two induced voltages $U_{2i}$ ($U_H$ corresponds to the induced voltage $U_{21}$ with the ferrite core 35 and $U_L$ corresponds to the induced voltage $U_{21}$ without ferrite core 35). In this way, it is ensured that an induced voltage $U_{2i}$ which is greater in its amplitude than the threshold voltage $U_s$ is recognized as voltage $U_H$. The switch position allocated to the associated secondary coil 21, 22 or 23 is then recognized as the actually adopted switch setting.

Conversely, an induced voltage $U_{2i}$ which is smaller in its amplitude than the threshold voltage $U_s$ is recognized as voltage $U_L$. Thus, component or production tolerances of the switch have no influence on the reliable recognition of the switch position. Thus, the secondary coils 21, 22 or 23 may differ, as a result of tolerance, in their dimensions, such as winding area, or in their number of windings N, without this having an influence on the correct determination of the switch position.

The switch lever 30 is preferably made of a ferrite material. Paramagnetic and in particular ferromagnetic substances, which are also designated as ferrites, are suitable for this purpose. These substances have a relative permeability $\mu_r >> 1$, e.g. $\mu_r = 1000$ or 10,000. As a result of this, a marked increase in the induced voltage $U_{2i}$ is achieved when the switch lever 30 is situated in a corresponding switch position in the vicinity of a secondary coil 21, 22 or 23.

The primary coils 10, the secondary coils 21, 22, 23 and—where contact surfaces 32 are present in the region of the secondary coils—also the contact surfaces 32 are preferably designed as electrically conductive layers of a printed circuit board. The primary coil 10 and the secondary coils 21, 22 or 23 may be implemented as spiral shaped conductor tracks on the printed circuit board.

If a printed circuit board is used as a carrier for the primary coils 10, the secondary coils 21, 22, 23 and the contact surfaces 32, then the switch lever 30 is moved into its various switch positions substantially in one plane. The design construction of the switch then has a very simple form.

Besides the contact surfaces 32, all further conductor tracks of the printed circuit board may be protected, by a protective layer, against mechanical abrasion as a result of the movement of the switch lever 30.

The printed circuit board may preferably be a multilayer printed circuit board. In that case, the primary coil 10 and the secondary coils 21, 22, 23 are disposed in different conductive layer planes. If the thickness of the layers is not too large, the magnetic coupling between the primary coil 10 and the secondary coils 21, 22, 23 is still sufficiently great.

Since coils in the form of spiral shaped conductor tracks can be made very small in their dimensions (minimum width of a conductor track approximately 100 $\mu$m and spacing from an adjacent conductor track also approximately 100 $\mu$m), the extensions of the switch, i.e. the spacings of the switch positions from one another, can be made very small.

In the event that the numbers of windings N of the secondary coils 21, 22, 23 should not be intended to be equal, that the air gap between the primary coil 10 and one of the secondary coils 21, 22, 23 should be different from switch position to switch position or that there should be production tolerance of the components used, such as of the evaluating unit, then—according to equations (1) or (4)—the induced voltages $U_{2i}$—without ferrite core 35—are likewise different. In order to take this into account, the induced voltages $U_{2i}$ can be measured without ferrite core 35 upon commencement (in an initialization phase) and stored as reference values in the evaluating unit 34. When the switch position is to be detected, the currently measured induced voltages $U_{2i}$ are compared with the stored values. The switch lever 30, with its ferrite core 35, is situated at that secondary coil 21, 22 or 23 at which the substantially greatest deviation from the stored values exists.

In place of the oscillator 33 it is also possible to use on the primary side a pulse generator which uses not only alternating voltages, but also pulsed signals (PWM signals; pulse width modulated signals) for generating a magnetic field.

The induced voltages $U_{2i}$ on the secondary side are fed via a non-illustrated low pass filter to the evaluating unit 34. Downstream of the low pass, direct voltages are then available, the amplitudes of which are proportional to the amplitudes of the induced voltages $U_{2i}$.

In the case of pulse width modulated signals, the evaluating unit 34 (for example a microprocessor) sets the working point AP in such a way that the voltage $U_{2i}$ induced in at least two secondary coils 21, 22 or 23 is markedly different. To this end, the bias voltage is increased from 0 V to such an extent that the threshold voltage $U_s$ lies between the voltage $U_H$ and the voltage $U_L$. In this way, it is ensured that each switch setting or switch position is reliably recognized.

To set the working point AP, in the first instance a start is made with a low threshold voltage $U_s$. The ferrite core 35 can only be in one switch position. In succession (or simultaneously), the induced voltages $U_{2i}$ are measured. In the most unfavorable case (worst case), initially the output voltages $U_a(t)$ do not differ. Thereupon, the threshold voltage $U_s$ is increased stepwise to such an extent that the induced voltage $U_{2i}$ of that secondary coil 21, 22 or 23 within the region of which the ferrite core 35 is situated generates a signal change in the output voltage $U_a(t)$. This is then a possible working point AP.

Conversely, the threshold voltage $U_s$ can also begin at very large amplitude and be reduced stepwise until a signal change in the output voltage $U_a(t)$ is recognized. This amplitude position is then used as the working point AP.

The two processes can also be applied at the same time; in this case, the threshold voltage $U_s$ is then set between the two threshold voltages $U_s$ previously determined as working point AP. As a consequence of this, a reliable working point AP is determined, with which the detection of the switch position is possible in perfect fashion, even in the case of unfavorable temperature influences and component tolerances.

There may be only a single primary coil 10, which surrounds all secondary coils 21, 22, 23 (as shown in FIG. 1). A separate primary coil 10 may also be allocated to each secondary coil 21, 22 or 23. However, all primary coils 10 must then be excited with approximately the same voltage amplitude $U_1$, so that the voltages $U_{2i}$ induced in the secondary coils 21, 22, 23 are comparable with one another.

The switch lever 30 may be produced entirely from ferrite material. For the invention, it is however sufficient if only its position-side end is produced from a ferrite material. Likewise, one or more small ferrite coils 35 can be secured to the position-side end of the switch lever 30.

The structural design of the switch lever 30 is not essential to the invention. On the other hand, it is essential that the switch lever 30 has an influence on the magnitude of the voltage $U_{2i}$ induced in a secondary coil 21, 22 or 23, and especially in circumstances in which the switch lever 30 is situated in the switch position allocated to the secondary coil 21, 22 or 23.

With the switch according to the invention, the switch position is recognized reliably and without requiring direct contact. The switch function is not impaired by the detection of the switch position.

Such switches are preferably used in motor vehicles as light switches, windshield wiper switches or other switches. Such switches can be mechanically actuated by hand. The switch setting is recognized and is transmitted via the onboard power supply or a data bus of the motor vehicle to other units, where further functions in the motor vehicle are controlled by reference to the recognized switch setting. The detection of the switch settings can also be used for the optical or acoustic indication of the switch setting.

We claim:

1. An electrical switch, comprising:
   a switch lever with a first end movably disposed into at least two switch setting positions each defining a respective switch function of the electrical switch;
   a magnetic flux amplifying element disposed at said first end of said switch lever;
   inductive pickups associated with each of the switch setting positions and disposed so as to be adjacent said magnetic flux amplifying element when said switch lever is moved into one of the switch setting positions; and
   an evaluating unit connected to said inductive pickups evaluating signals of said inductive pick-up and determining which of the switch setting positions have been adopted by said switch lever.

2. The switch according to claim 1, which further comprises an exciter unit in the form of a primary coil, and wherein said inductive pick-ups are a plurality of secondary coils allocated to said primary coil.

3. The switch according to claim 2, which further comprises contact surfaces of the electrical switch at said switch setting positions, and wherein said primary coil, said secondary coils, and said contact surfaces are electrically conductive layers of a printed circuit board.

4. The switch according to claim 1, wherein said inductive pickups are secondary coils, and including an exciter unit driven by said evaluating unit and connected to said primary coil for generating an alternating magnetic field inducing in said secondary coils respective alternating voltages, said evaluating unit measuring and evaluating the alternating voltages.

5. The switch according to claim 1, wherein said magnetic flux amplifying element is produced from a material selected from the group consisting of paramagnetic materials and ferromagnetic materials, and which comprises a primary coil generating a magnetic flux, the magnetic flux being amplified in a region of said magnetic flux amplifying element and conducted to one of said inductive elements.

6. The switch according to claim 1, wherein said inductive pickups are secondary coils.

\* \* \* \* \*